(12) United States Patent
Dupuis (10) Patent No.: US 8,981,852 B2
(45) Date of Patent: Mar. 17, 2015

(54) PROVIDING AN INTEGRATED DIRECTIONAL COUPLER IN A POWER AMPLIFIER

(71) Applicant: Avago Technologies General IP (Singapore) Pte. Ltd., Singapore (SG)

(72) Inventor: Timothy Dupuis, West Lake Hills, TX (US)

(73) Assignee: Avago Technologies General IP (Singapore) Pte. Ltd. (SG)

( * ) Notice: Subject to any disclaimer, the term of this patent is extended or adjusted under 35 U.S.C. 154(b) by 138 days.

(21) Appl. No.: 13/674,414

(22) Filed: Nov. 12, 2012

(65) Prior Publication Data

US 2014/0132355 A1    May 15, 2014

(51) Int. Cl.
*H03F 3/14*    (2006.01)

(52) U.S. Cl.
USPC .............................. 330/307; 330/310; 330/53

(58) Field of Classification Search
USPC ........................................... 330/307, 310, 53
IPC .......................................................... H03F 3/14
See application file for complete search history.

(56) References Cited

U.S. PATENT DOCUMENTS

| | | | |
|---|---|---|---|
| 4,097,814 A * | 6/1978 | Cohn | 330/286 |
| 5,300,068 A * | 4/1994 | Rosar et al. | 606/34 |
| 6,046,641 A * | 4/2000 | Chawla et al. | 330/277 |
| 6,420,929 B1 | 7/2002 | Ha | |
| 6,545,542 B2 | 4/2003 | Matsuyoshi et al. | |
| 6,759,922 B2 | 7/2004 | Adar et al. | |
| 6,859,097 B2 * | 2/2005 | Chandler | 330/107 |
| 7,358,807 B2 * | 4/2008 | Scuderi et al. | 330/140 |
| 7,728,661 B2 | 6/2010 | Bockelman et al. | |
| 8,228,123 B2 * | 7/2012 | Blednov | 330/295 |
| 8,467,739 B2 * | 6/2013 | Vajha et al. | 455/75 |
| 2011/0195677 A1 | 8/2011 | Misra | |
| 2012/0113553 A1 | 5/2012 | Dupuis | |
| 2012/0161898 A1 | 6/2012 | Gorbachov | |

* cited by examiner

*Primary Examiner* — Patricia Nguyen (57) ABSTRACT

A power amplifier includes a power amplifier core including a plurality of gain stages to receive a radio frequency (RF) signal and to output an amplified RF signal, an output network coupled to the power amplifier core to receive the amplified RF signal and output a transmit output power signal, and a directional coupler coupled to the output network to obtain a coupled signal proportional to the transmit output power signal. Each of these components can be configured on a single semiconductor die, in an embodiment.

22 Claims, 8 Drawing Sheets

PROVIDING AN INTEGRATED DIRECTIONAL COUPLER IN A POWER AMPLIFIER

BACKGROUND

In wireless communication devices, radio frequency (RF) power amplifiers (PAs) are often used to provide transmit signals at increased power levels needed for operation within a communication system. For example, cellular telephone devices use PAs to transmit signals at power levels needed to communicate effectively with cellular base stations. In addition, these transmit power levels are often regulated by the communication device. In many communication devices, a directional coupler is used to split off a proportional part of the transmit output signal so that the transmit output power can be monitored by the device.

SUMMARY OF THE INVENTION

According to one aspect, a power amplifier includes a power amplifier core including a plurality of gain stages to receive a radio frequency (RF) signal and to output an amplified RF signal, an output network coupled to the power amplifier core to receive the amplified RF signal and output a transmit output power signal, and a directional coupler coupled to the output network to obtain a coupled signal proportional to the transmit output power signal. Each of these components can be configured on a single semiconductor die.

In turn, a first bond wire is coupled to a first pad coupled to the output network and to a second pad coupled to an input port of the directional coupler. And a second bond wire is coupled to a third pad coupled to a coupling port of the directional coupler and to a fourth pad coupled to an input of an electrostatic discharge (ESD) circuit. A third bond wire can be coupled to a fifth pad coupled to an output of the ESD circuit and to an output pad of a semiconductor package.

In an embodiment, the directional coupler includes a first transmission line formed on a first metal layer and coupled between the second pad and a sixth pad on the single semiconductor die and a second transmission line formed on a second metal layer and coupled between seventh and eighth pads on the single semiconductor die. The directional coupler may further include a first capacitor coupled between the first and second transmission lines and a second capacitor coupled between the first transmission line and a reference voltage node. In addition, the directional coupler may include a third capacitor coupled between the second transmission line and the reference voltage node and a fourth capacitor coupled between the second transmission line and the reference voltage node.

In an embodiment, the output network includes a first transformer having a first inductor coupled to a final one of the plurality of gain stages and a second inductor coupled to the first pad and a second transformer having a third inductor coupled to the final one of the plurality of gain stages and a fourth inductor coupled to the first pad. In turn, the first pad may be located between the first transformer and the second transformer.

Another aspect of the present invention is directed to a power amplifier with multiple gain stages to receive a RF signal and to output an amplified RF signal, an output network coupled to the gain stages to receive the amplified RF signal and to output a transmit power signal via an output pad of the output network, and a directional coupler having an input port, an output port, a coupling port and an isolation port. This coupler is coupled to the output network via a bond wire coupled to the output pad of the output network and to the input port of the directional coupler. The output network and the directional coupler may be configured on a single semiconductor die.

Another aspect of the present invention is directed to a method including forming a PA and a RF coupler on a single semiconductor die as described above. The method includes attaching a first bond wire between the output network and the input port of the RF coupler, and attaching a second bond wire between the output port of the RF coupler and a first off-die pad of a semiconductor package. Note that these attachment operations can be performed in any order. The method may further include attaching a third bond wire between the coupling port of the RF coupler and an input of an ESD circuit of the single semiconductor die, and attaching a fourth bond wire between an output of the ESD circuit and a second off-die pad of the semiconductor package.

DETAILED DESCRIPTION

In various embodiments, a power amplifier (PA) such as configured on a single semiconductor die can include an on-die directional coupler to split off a proportional part of an output signal from the PA. This proportional signal can be used in monitoring output power of the PA. By providing an on-die directional coupler, the size and expense of a separate coupler, either as a separate chip or as a separate die within a multichip module can be avoided.

Although in some implementations this on-die directional coupler can be directly coupled to an output network of the PA, in many cases the directional coupler can be located in a physically distinct location of the die from the output network to provide a measure of isolation. Thus to couple the output signal to the directional coupler, an interconnection means is provided. In many embodiments, this interconnection means is a bond wire that acts to couple the output network to the directional coupler. This bond wire accordingly is an intra-die (i.e., same-die-to same-die) bond wire that couples together two points on a single semiconductor die. In this manner, the output network and the directional coupler can be physically isolated on the die, yet also physically connected to enable a proportional measure of transmit output power to be split from the main power output signal and provided to monitoring circuitry, either within the PA itself or within a device coupled to the PA such as a transceiver or baseband processor.

Figure 1:
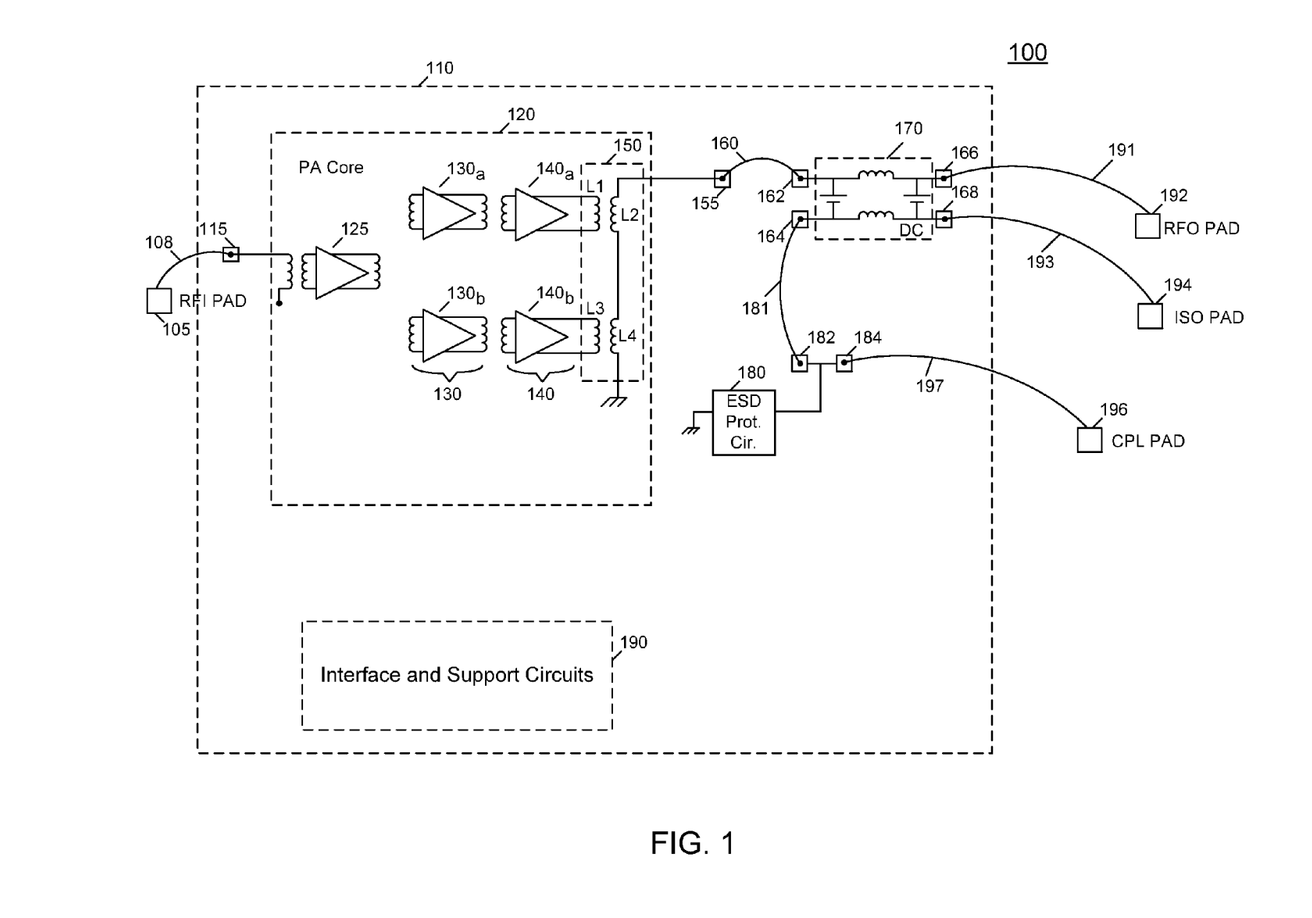
FIG. 1 is a schematic diagram of a power amplifier in accordance with an embodiment of the present invention.

Referring now to FIG. 1, shown is a schematic diagram of a power amplifier in accordance with an embodiment of the present invention. As shown in FIG. 1, PA 100 is a complementary metal oxide semiconductor (CMOS) power amplifier that is integrated on a single semiconductor die 110 and is implemented within a package. Although different kinds of semiconductor packaging can be provided, in an embodiment die 110 can be configured within a semiconductor package such as a dual flat no lead (DFN), a land grid array (LGA) or another package type that includes a plurality of pads around a periphery of the package to provide interconnection through the package to off-chip devices such as other components of a wireless system including, on an input side a transceiver, and on an output side an antenna or other radiation means.

As seen, an incoming RF signal is coupled to an input of the PA via an input pad 105 of the package (namely an RF input (RFI) pad). Via a bond wire 108 that couples this off-die pad to an on-die pad 115, a connection is thus made to the PA. In the embodiment shown, a PA core 120 includes a pre-driver stage 125 that receives this incoming RF signal, which may be single-ended and conditions it into a differential and pre-driven signal. In turn this signal is provided to a driver stage 130 including parallel paths 130a and 130b. In some embodiments, these different paths may correspond to a low power path and a high power path. Depending on particular requirements of a communication protocol only one of these paths may be enabled. After amplification in driver stage 130, the amplified RF signal is provided to a final stage 140 including parallel paths 140a and 140b for further amplification of the RF signal to a desired transmit output power level.

Note that while PA core 120 is shown in a simplified view with three stages, understand the scope of the present invention is not limited in this aspect and more or fewer stages may be present. In an embodiment, the gain devices of each of these stages are implemented using transconductors formed of metal oxide semiconductor field effect transistor (MOSFET) devices, such as described more fully in U.S. Pat. No. 7,728,661, the disclosure of which is hereby incorporated by reference. Of course instead of CMOS transistor-based amplifier stages, other types of gain stages including GaAs or bipolar transistors may be used. Note also in FIG. 1 that the coupling between the various stages is via inductive coupling realized using a plurality of on-die inductors. Instead of this magnetic-based coupling, a capacitive or other electrical-type coupling between the different stages is possible.

From final stage 140, the transmit output signal couples through an output network 150 which in the embodiment shown is formed using a pair of transformers, namely a first transformer formed of coupled inductors L1 and L2 and a second transformer formed of coupled inductors L3 and L4. The resulting transmit output signal thus couples to an on-die pad 155 that in turn couples to another on-die pad 162 via a die-die bond wire 160. In this way, physical isolation is provided between output network 150 and a directional coupler 170.

As seen, directional coupler 170 includes four ports including an input port 162 and an output port 166 (both reference numerals also identified with a corresponding on-die pad) along with a coupled port 164 and an isolation port 168 (both also identified with an on-die pad). The incoming amplified transmit signal received via input port 162 passes via a transmission line to output port 166 and is provided off-chip as the transmit (TX) signal. Via this directional coupler, the transmit output signal from output port 166 is communicated off-chip via a bond wire 191 that in turn couples to an RF output (RFO) pad 192 within the lead frame. Directional coupler 170 also includes a second transmission line that is electro-magnetically coupled to the other transmission line such that the signal on coupled port 164 provides power proportional to the transmit forward power wave of the RF signal passing through ports 162 and 166, and such that the signal on isolation port 168 provides power proportional to the reverse transmit power wave of the RF signal passing through ports 162 and 166. The RF forward power indicator signal can be used as an RF transmit (TX) power indicator signal. For example, this RF transmit (TX) power indicator signal can be used by external circuitry to determine the transmit power being provided by the PA, which can then be used to adjust a transmit (TX) power control signal in order to achieve the desired transmit power to an antenna.

By way of the coupling realized within directional coupler 170 a coupled version of this signal is communicated via a die-die bond wire 181 and in turn via a bond wire 197 to a coupling (CPL) pad 196 within the lead frame. Note that in the embodiment shown, to provide electrostatic discharge protection for this signal, the coupled signal is coupled to an ESD protection circuit 180, which in an embodiment can be implemented via one or more diodes, as described in U.S. Publication No. 2012/0113553, the disclosure of which is hereby incorporated by reference. Of course in some embodiments this ESD circuit may not be provided and the coupled port of the directional coupler may be directly coupled to an off-chip connection. Via another on-die pad 184 this ESD-protected coupled signal is communicated via bond wire 197 to CPL pad 196. As further seen, the isolated signal from isolation port 168 of directional coupler 170 may couple via bond wire 193 to an isolation (ISO) pad 194.

As further shown, additional circuitry 190 is present on die 110 to provide for interface and support. Such circuitry may include control circuitry, sensing circuitry and so forth. Although shown at this high level in the embodiment of FIG. 1, understand the scope of the present invention is not limited in this regard.

Figure 2:
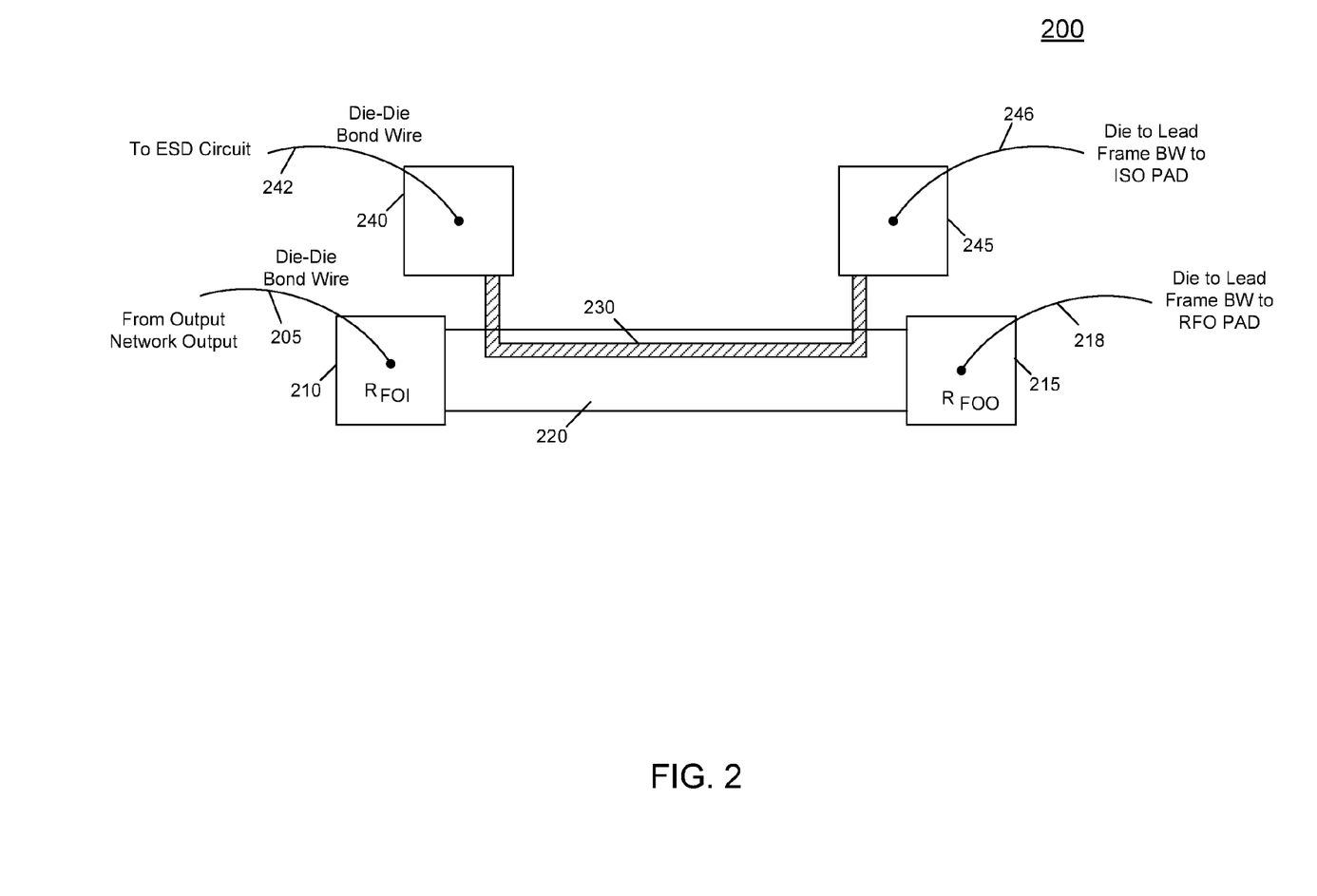
FIG. 2 is a schematic diagram regarding further details of a directional coupler in accordance with an embodiment of the present invention.

Referring now to FIG. 2, shown is a schematic diagram regarding further details of a directional coupler in accordance with an embodiment of the present invention. Specifically shown in FIG. 2 is a top level view of a layout of a directional coupler 200. As seen, in general the directional coupler may be formed by a pair of transmission lines 220 and 230. Transmission line 220 is coupled between a first pad 210 and a second pad 215, where first pad 210 may receive the amplified RF output signal via a die-die bond wire 205 from the output network of the PA. In an embodiment, transmission line 220 may have a length of approximately 280 microns ($\mu$m) and a width of approximately 50 $\mu$m. This signal thus is communicated via transmission line 220 to RF output bond pad 215 that in turn couples to a bond wire 218 that in turn is coupled to an off-chip bond pad within the lead frame or other semiconductor package (not shown in FIG. 2). In an embodiment, transmission line 220 may be formed on a given layer of a multi-layer semiconductor die. As one example, transmission line 220 and corresponding bond pads may be formed on a metal 7 (M7) layer, which may be formed in a particular implementation as a copper (Cu) layer of a relatively large thickness, e.g., three microns ($\mu$m).

To provide magnetic coupling, second transmission line 230 may be configured in close physical arrangement to transmission line 220 to thus provide a measure of magnetic coupling such that a small portion of the output power couples into this transmission line. In an example embodiment, this portion may be approximately −20 dB with regard to the transmit output signal. As seen transmission line 230 at least partially overlays transmission line 220, and couples between bond pads 240 and 245. Further note that bond pad 240 is coupled to another die-die bond wire 242 that in turn couples to an on-die ESD circuit to provide the coupled signal to the ESD circuit. In turn, bond pad 245 is coupled via a die-to-lead frame bond wire 246 to an isolation pad within the package. In an embodiment transmission line 230 may be formed on a different metal layer, e.g., a metal 8 (M8) layer formed above the M7 layer and above an intervening dielectric layer, e.g., formed of $SiO_2$. In an embodiment transmission line 230 may be of a thinner width, e.g., transmission line 230 may have a trace width of approximately 5 µm.

As the RF signal passes through coupler 200, coupling between the primary signal path of first transmission line 220 and the secondary signal path of second transmission line 230 generates the signals for the coupled port 240 and the isolated port 245, as described above. Inductive or magnetic coupling occurs, along with capacitive or electrical coupling within the RF coupler between the primary and secondary signal paths. As such, directional coupler 200 provides outputs, namely a signal output and an isolated output via pads 215 and 245 respectively to off-chip bond pads via die-to-lead frame bond wires. Also, directional coupler 200 further provides a coupled or proportional output signal to additional on-die circuitry via bond pad 240 through die-die bond wire 242. Although shown at this high level in the embodiment of FIG. 2, understand the scope of the present invention is not limited in this regard.

Figure 3:
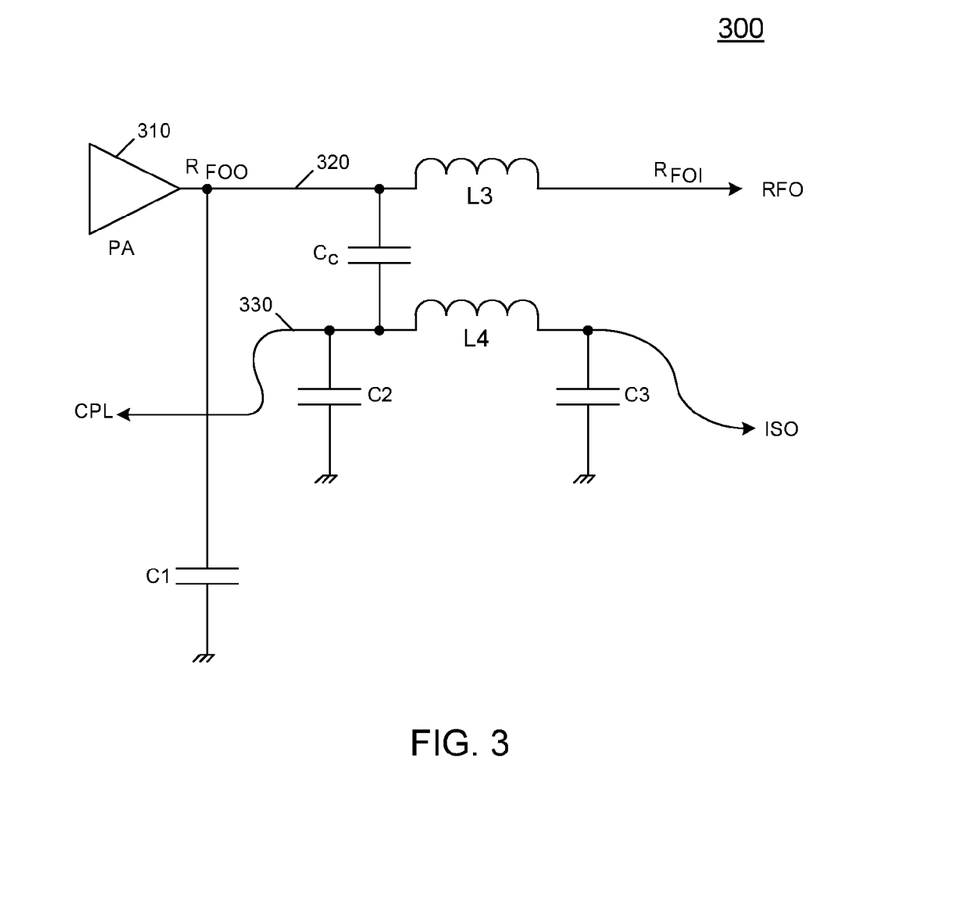
FIG. 3 is an electrical schematic diagram of a directional coupler in accordance with an embodiment of the present invention.

Referring now to FIG. 3, shown is an electrical schematic diagram of a directional coupler in accordance with an embodiment of the present invention. As shown in FIG. 3, circuit 300 includes a PA core 310, which in general includes the main signal processing path of the PA from its input to an output of an output network of the PA. As seen, the output from PA core 310 is communicated via a transmission line 320 and is output as an RF output signal RFO. In this schematic diagram, transmission line 320 is represented by an inductor L3. In turn this transmission line 320 is in physical proximity to a second transmission line 330, represented by a second inductor L4 to thus couple a proportional amount of the transmit output power as a coupled signal to a coupler port CPL of the directional coupler. Note that this coupled signal provided to a coupled signal output of the PA may be directly from transmission line 320, or it can in turn be coupled through an ESD circuit to provide ESD protection, prior to being output from the PA. Still further, transmission line 320 also provides an isolated output that is coupled via an isolation port ISO. The magnetic coupling realized by these closely coupled transmission lines may be on the order of approximately 400 picoHenries (pH), in an embodiment. This inductor may be formed as a combination of the magnetic coupling between bond wires in the package and the magnetic coupling of the on-chip coupler component.

Note in the schematic of FIG. 3, a capacitance C1 is coupled in shunt between transmission line 320 and a reference voltage node (namely ground or e.g., ground). Capacitor C1 may be a small capacitor, e.g., on the order of between approximately 0-200 femtoFarads (fF), and is used to tune out the inductance of the coupler and bond wires to present the PA with an output impedance of close to 50 ohms. In addition, a capacitance may be coupled in parallel between transmission lines 320 and 330, namely a capacitance Cc, which in an embodiment can be implemented via a combination of intentional and parasitic capacitances. In an embodiment, coupling capacitance Cc may be on the order of approximately 150 fF. The parasitic capacitance may exist between bond wires in the package and the coupler structure on chip. In addition a capacitor component may be placed on chip which is equal to 150 fF–$C_{parasitic}$. In an embodiment, this on-chip capacitor may be approximately 60 fF and more generally may be within the range of approximately 0-100 fF. Similarly, additional capacitors C2 and C3 may couple in shunt between transmission line 330 and the reference voltage node to tune out the inductance of the coupler and bond wires to allow the CPL and ISO package outputs to achieve a 50 ohm match. While capacitors C1, C2 and C3 may be primarily formed as parasitic capacitors to a ground shield in the coupler structure, some small fixed capacitors may be present. For an example 1.95 GHz coupler, Band 1, an electrical coupling of approximately 150 fF and a magnetic coupling of approximately 400 pH may achieve high directivity.

Figure 4:
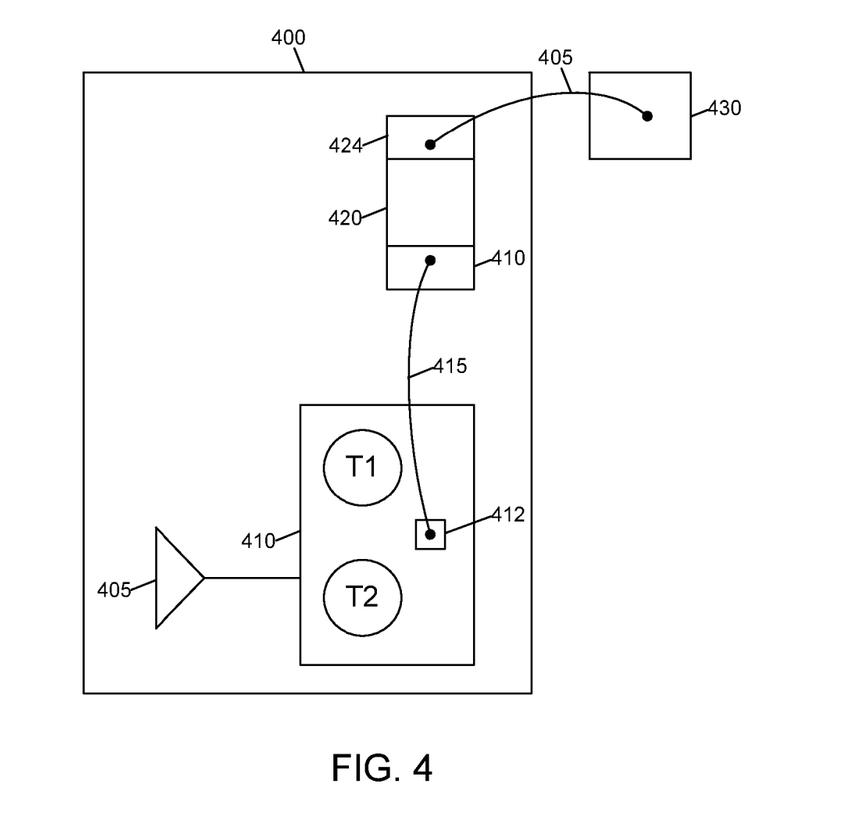
FIG. 4 is a top view illustration of a PA die in accordance with an embodiment of the present invention.

Referring now to FIG. 4, shown is a top view illustration of a PA die in accordance with an embodiment of the present invention. As shown, FIG. 4, die 400 is a single CMOS die that includes all circuitry of a PA, which can be incorporated into a given semiconductor package such as a dual flat no leads (DFN) package. In the high level illustration shown, a PA core 405 couples to an output network 410 that in the embodiment shown includes a pair of transformers T1 and T2. At a midpoint between these transformers, an output pad 412 is provided that is coupled to a die-die bond wire 415 that in turn couples to an input pad 422 of a directional coupler 420. As seen, an output pad 424 couples via a bond wire 425 to a die-to-off-chip pad 430 to thus provide the output power signal. Also as described herein but not shown for ease of illustration understand that a coupler port of directional coupler 420 is coupled to an ESD circuit, e.g., via another die-die bond wire (not shown in FIG. 4) to provide for ESD protection (and then to an off-chip pad). However in other implementations a direct coupling via a bond wire from directional coupler 420 to another off-chip pad can occur for this coupled signal.

Figure 5:
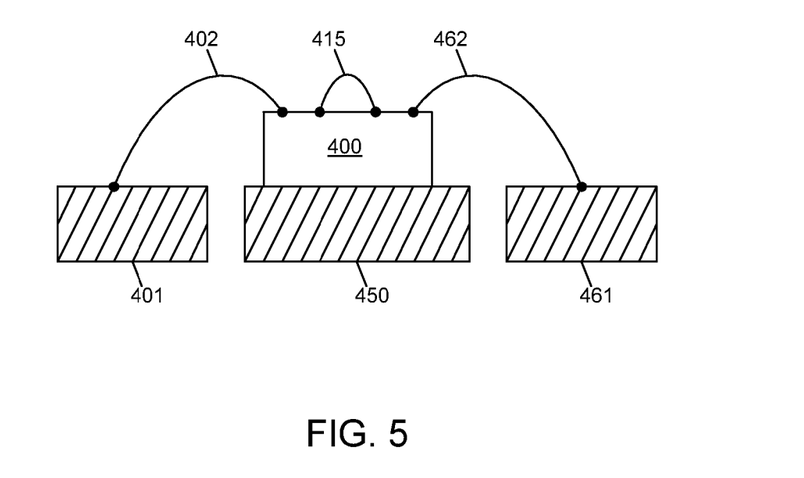
FIG. 5 is a cross section view of a semiconductor package in accordance with an embodiment of the present invention.

Referring now to FIG. 5, shown is a cross section view of a semiconductor package in accordance with an embodiment of the present invention. As seen in FIG. 5, die 400 is configured on a substrate 450 which in an embodiment can be a copper ground slug coupled to a backside of the die to provide electrical conductivity and good thermal performance. Note the presence of die-die bond wire 415 to thus couple two points on the same die. As further seen, an input RF signal, e.g., received from a transceiver or other component of a system, is coupled to die 400 via a bond wire 402 coupled to an input pad 401 while in turn an amplified RF output signal couples via a bond wire 462 to an output pad 461 that in turn can couple to a radiation means such as an antenna.

Figure 5A:
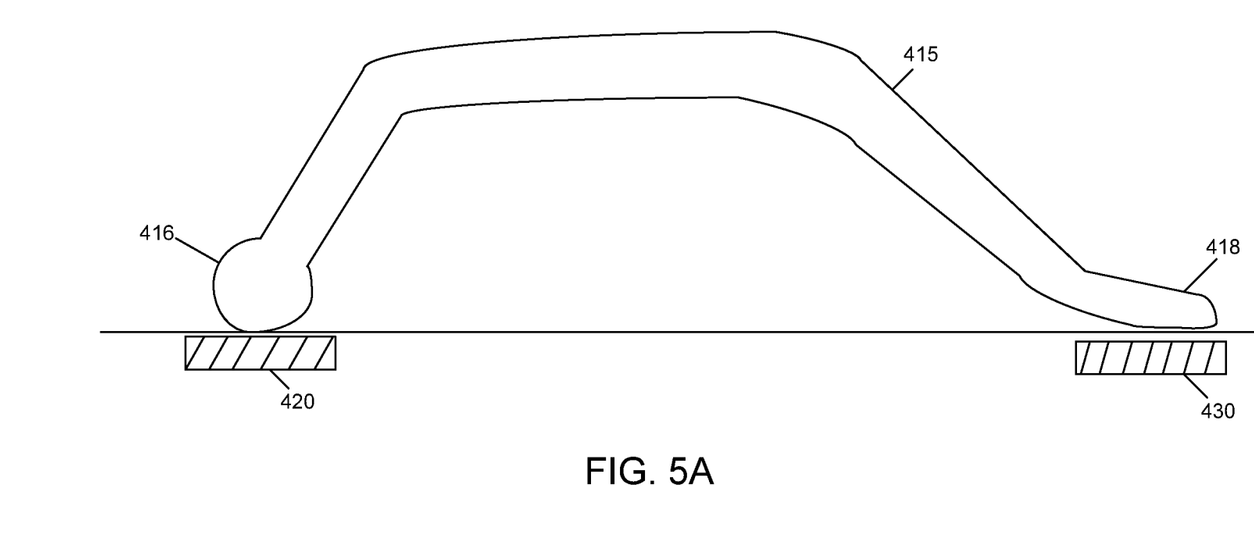
FIG. 5A is a further close up view of the cross section of FIG. 5.

FIG. 5A is a further close up view of the cross section of FIG. 5. In FIG. 5A, details of die-die bond wire 415 are shown. Specifically, a first end of wire 415 is configured as a ball 416 to provide a connection to an on-die pad 420 which in an example can be on a top metal layer, e.g., a M8 layer. In turn, a second end of bond wire 415 may be configured as a stitch or a more tapered end 418 that couples to a second on-die pad 430. In various embodiments, bond wire 415 may be formed of different materials such as gold. In an embodiment, the ball is formed by melting the bond wire end so it is molten when it attaches to the die pad, and the other end is a stitch where the wire is connected on the pad. The die-to-die bond wire may be gold or another appropriate conductive material.

Understand that other configurations are possible. For example, multiple PA's may be provided in a particular wireless system where each such PA is for purposes of one or more bands of a multi-band system such as a WCDMA, GSM, among other PA's.

Figure 6:
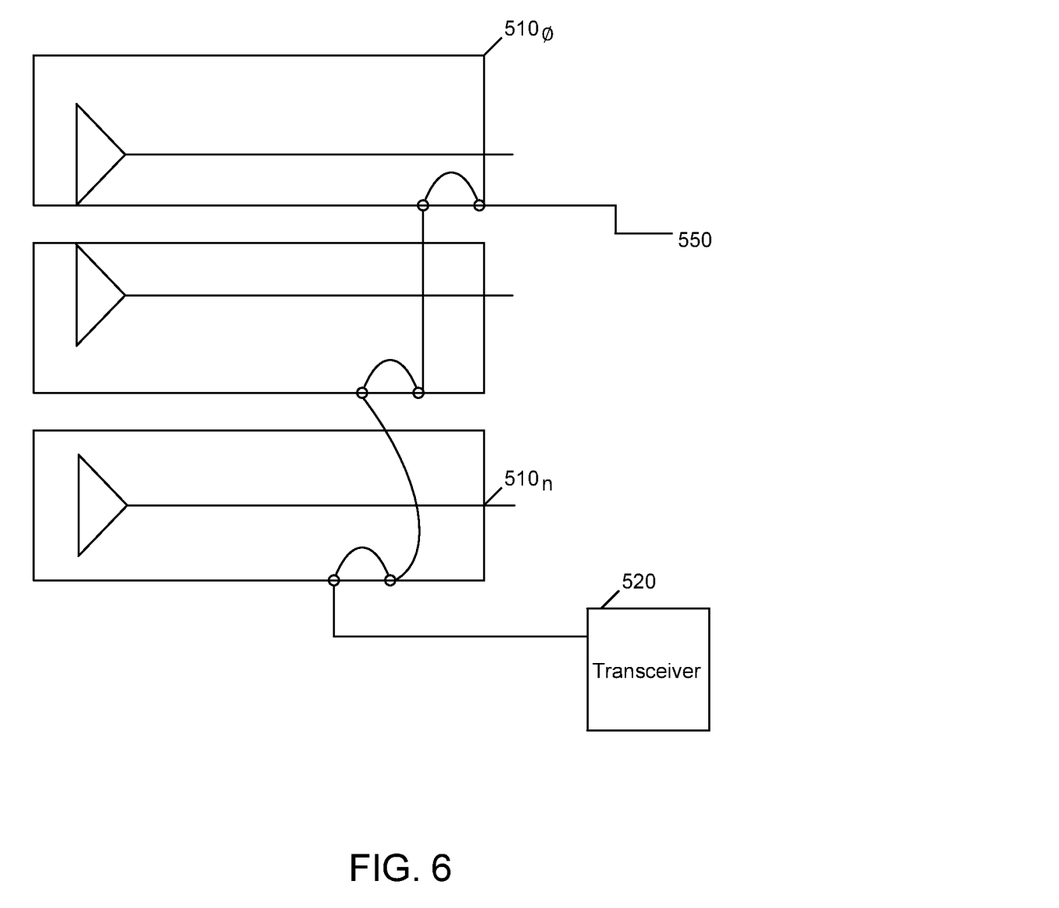
FIG. 6 is a block diagram of a plurality of PA's in accordance with an embodiment of the present invention.

Referring now to FIG. 6, shown is a block diagram of a plurality of PA's $510_0$-$510_n$. Each PA can be configured for a particular communication scheme. One or more of these PA's may be a CMOS PA as described herein and one or more of the PA's may be of another type of PA such as a GaAs or other type of PA. Each PA may include or be associated with a directional coupler such that feedback information regarding transmit output power can be provided from each of the PA's to anther system component, such as a transceiver 520. In an embodiment, the various feedback signals 550 can be coupled in daisy chain fashion, as shown in FIG. 6. Of course other implementations are possible such as an implementation in which each PA provides an independent feedback signal to the transceiver. One or more of PA's 510 may include an integrated directional coupler as described herein, effected at least in part via one or more die-die bond wires.

It is noted that the packaging of the CMOS PA die including integrated coupler into a single semiconductor package can be implemented in a variety of ways, using standard semiconductor packaging techniques. For example, the device can be encapsulated in a plastic, insulated package with external bond wires, external connection pins and/or external bonding pads as is done for many integrated circuits. However, it is understood that other packaging techniques could be utilized while still taking advantage of the single semiconductor die for a CMOS PA and integrated RF coupler as described herein.

Figure 7:
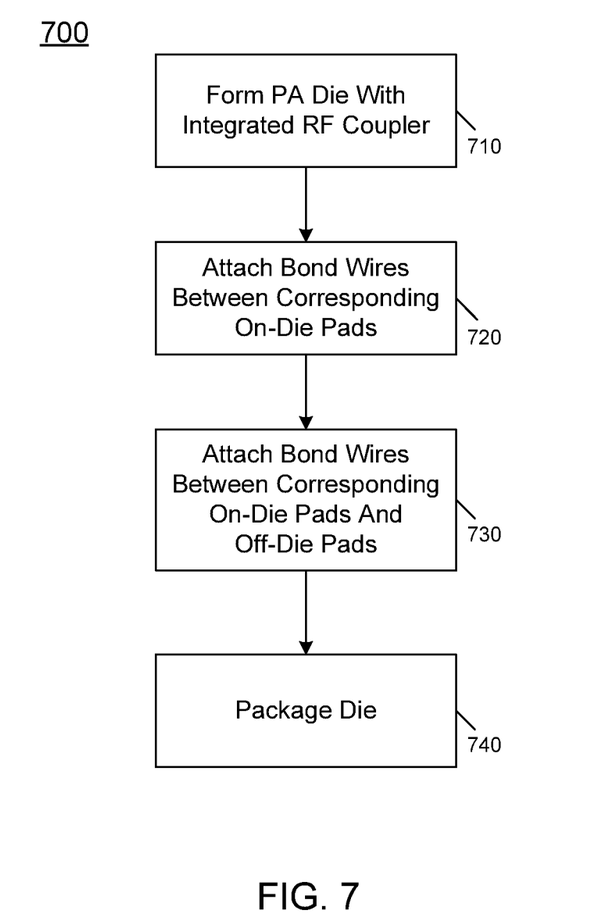
FIG. 7 is a flow diagram of a method for fabricating a power amplifier in accordance with an embodiment of the present invention.

Referring now to FIG. 7, shown is a flow diagram of a method for fabricating a power amplifier in accordance with an embodiment of the present invention. As shown in FIG. 7, method 700 may begin by forming a PA die with an integrated RF coupler (block 710). In general, this semiconductor fabrication can occur using typical semiconductor processing techniques such as for a CMOS process. However note that as part of this process, multiple metal layers may be provided with transmission lines, pads, capacitances and so forth to enable co-location of a directional RF coupler with the PA circuitry.

At block 720 one or more bond wires can be attached between corresponding on-die pads. In the particular implementations discussed above with an on-die ESD circuit, one bond wire can couple between an output network of the PA and the directional coupler input, and another bond wire can couple between the directional coupler coupling port and this ESD circuit. Such bond wire connections can be via heating one end of the bond wire to make a connection with one bond pad and then applying a stitch to fasten the other end of the bond wire to another bond pad. Method 700 continues to block 730 where various bond wires can be coupled between on-die and off-die pads to thus provide input and output connections for the semiconductor device. Note that blocks 720 and 730 can be performed in either order, as there may be instances in which an on-die-to-off-die bond wire is attached prior to die-die bond wires due to clearance issues. Finally, the die can be packaged in a desired semiconductor package (block 740).

Figure 8:
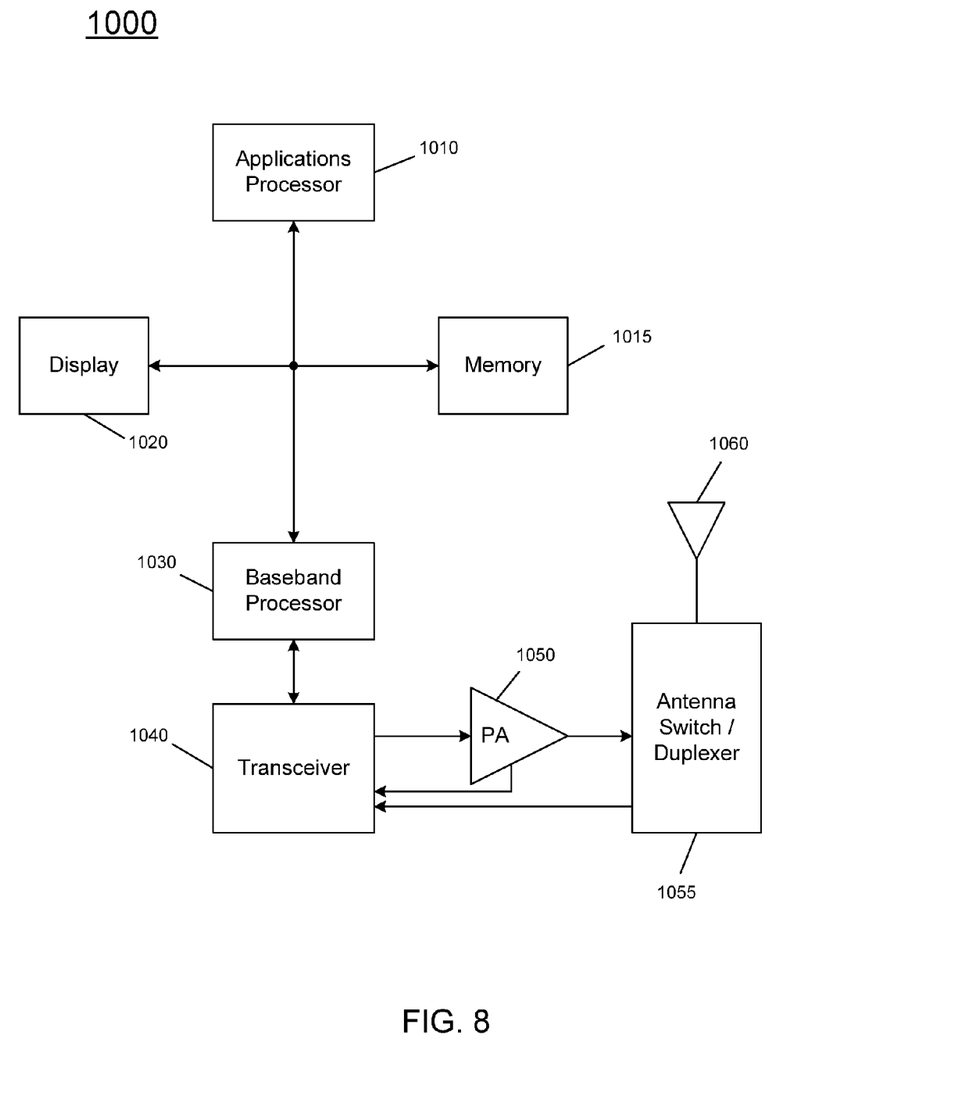
FIG. 8 is a block diagram of a wireless device in accordance with an embodiment of the present invention.

As described above, a PA such as a CMOS PA in accordance with an embodiment of the present invention can be implemented in many different device types. Such a device can be used in various wireless systems, including handsets, mobile devices, PDAs, tablets and so forth. Referring now to FIG. 8, shown is a block diagram of a wireless device 1000 in accordance with an embodiment of the present invention. As shown in FIG. 8, wireless device 1000 may include an applications processor 1010 which may be a microprocessor or other programmable logic to handle various system features, such as running application programs desired by a user. To perform its functions, applications processor 1010 may communicate with a memory 1015, which may be a flash memory or other non-volatile memory. Applications processor 1010 may further communicate with a display 1020, such as an LCD display of the system. For handling RF communications, e.g., wireless phone calls, wireless data transmissions and so forth, e.g., according to a communications protocol such as GSM/EDGE, W-CDMA, or LTE, applications processor 1010 may communicate with a baseband processor 1030, which may handle baseband operations both for transmit and receive paths. In turn, baseband processor 1030 is coupled to a transceiver 1040, which may receive incoming baseband signals from baseband processor 1030, and perform processing to upconvert the signals to RF levels for transmission to a PA 1050. PA 1050 may be a power amplifier in accordance with an embodiment of the present invention that includes an integrated directional coupler to extract a proportional amount of a transmit output power signal and provide the coupled signal to transceiver 1040 for use in power control operations. In some embodiments, control information from baseband processor 1030 may be coupled through transceiver 1040 to PA 1050. In turn, PA 1050 may be coupled to an antenna switch, duplexer or both 1055 which in turn is coupled to an antenna 1060, which radiates the amplified RF signal (note in some embodiments, multiple antennas or other loads may be present).

As further shown in FIG. 8, in a receive path, antenna 1060 couples through antenna switch 1055 and possibly through the duplexer or SAW filters and then to transceiver 1040, which may demodulate the incoming RF signals back to baseband for transmission to baseband processor 1030 for further processing. While shown with this particular implementation in the embodiment of FIG. 6, the scope of the present invention is not limited in this regard.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A power amplifier comprising:
   a power amplifier core including a plurality of gain stages to receive a radio frequency (RF) signal and to output an amplified RF signal;
   an output network coupled to the power amplifier core to receive the amplified RF signal and output a transmit output power signal; and
   a directional coupler coupled to the output network to obtain a coupled signal proportional to the transmit output power signal, wherein the power amplifier core, the output network, and the directional coupler are configured on a single semiconductor die.

2. The power amplifier of claim 1, further comprising a first bond wire coupled to a first pad on the single semiconductor die coupled to the output network and to a second pad on the single semiconductor die coupled to an input port of the directional coupler.

3. The power amplifier of claim 2, further comprising a second bond wire coupled to a third pad on the single semiconductor die coupled to a coupling port of the directional coupler and to a fourth pad on the single semiconductor die coupled to an input of an electrostatic discharge (ESD) circuit.

4. The power amplifier of claim 3, further comprising a third bond wire coupled to a fifth pad on the single semiconductor die coupled to an output of the ESD circuit and to a output pad of a semiconductor package including the single semiconductor die.

5. The power amplifier of claim 2, wherein the directional coupler comprises: a first transmission line formed on a first metal layer and coupled between the second pad and a sixth pad on the single semiconductor die; and a second transmission line formed on a second metal layer and coupled between seventh and eighth pads on the single semiconductor die.

6. The power amplifier of claim 5, further comprising: a first capacitor coupled between the first transmission line and the second transmission line; and a second capacitor coupled between the first transmission line and a reference voltage node.

7. The power amplifier of claim 6, further comprising: a third capacitor coupled between the second transmission line and the reference voltage node; and a fourth capacitor coupled between the second transmission line and the reference voltage node.

8. The power amplifier of claim 5, wherein a first end of the second transmission line is coupled to an electrostatic discharge (ESD) circuit configured on the single semiconductor die and a second end of the second transmission line is coupled to an isolation pad of a semiconductor package including the single semiconductor die.

9. The power amplifier of claim 2, wherein the directional coupler is physically isolated from the output network via the first bond wire.

10. The power amplifier of claim 1, wherein the directional coupler comprises a RF coupler.

11. The power amplifier of claim 2, wherein a first end of the first bond wire comprises a ball to be melted into attachment to the first pad, and a second end of the first bond wire comprises a stitch to couple to the second pad.

12. The power amplifier of claim 2, wherein the output network comprises: a first transformer having a first inductor coupled to a final one of the plurality of gain stages and a second inductor coupled to the first pad; and a second transformer having a third inductor coupled to the final one of the plurality of gain stages and a fourth inductor coupled to the first pad.

13. The power amplifier of claim 12, wherein the first pad is located between the first transformer and the second transformer.

14. A power amplifier comprising:
    a plurality of gain stages to receive a radio frequency (RF) signal and to output an amplified RF signal;
    an output network coupled to the plurality of gain stages to receive the amplified RF signal and to output a transmit power signal via an output pad of the output network; and
    a directional coupler having an input port, an output port, a coupling port and an isolation port, the directional coupler coupled to the output network via a bond wire coupled to the output pad of the output network and to the input port of the directional coupler, the output network and the directional coupler configured on a single semiconductor die.

15. The power amplifier of claim 14, wherein the directional coupler comprises: a first transmission line formed on a first metal layer and coupled between the input port and the output port; and a second transmission line formed on a second metal layer and coupled between the coupling port and the isolation port.

16. The power amplifier of claim 15, further comprising: a first capacitor coupled between the first transmission line and the second transmission line; and a second capacitor coupled between the first transmission line and a reference voltage node.

17. The power amplifier of claim 16, further comprising: a third capacitor coupled between the second transmission line and the reference voltage node; and a fourth capacitor coupled between the second transmission line and the reference voltage node.

18. The power amplifier of claim 14, wherein the coupling port is coupled to an electrostatic discharge (ESD) circuit configured on the single semiconductor die and the isolation port is coupled to an isolation pad of a semiconductor package including the single semiconductor die.

19. A method comprising:
    forming a power amplifier (PA) and a radio frequency (RF) coupler on a single semiconductor die including at least one gain stage to receive a RF signal and to output an amplified RF signal, an output network coupled to the at least one gain stage to receive the amplified RF signal and to output a transmit output power signal, and the RF coupler having an input port, an output port, a coupling port and an isolation port; attaching a first bond wire between the output network and the input port of the RF coupler; and attaching a second bond wire between the output port of the RF coupler and a first off-die pad of a semiconductor package.

20. The method of claim 19, further comprising attaching a third bond wire between the coupling port of the RF coupler and an input of an electrostatic discharge (ESD) circuit of the single semiconductor die.

21. The method of claim 20, further comprising attaching a fourth bond wire between an output of the ESD circuit and a second off-die pad of the semiconductor package.

22. The method of claim 19, further comprising attaching the second bond wire before the first bond wire.

* * * * *